(12) United States Patent
Mitani et al.

(10) Patent No.: US 7,576,365 B2
(45) Date of Patent: Aug. 18, 2009

(54) GROUP III NITRIDE SEMICONDUCTOR LIGHT-EMITTING DEVICE, FORMING METHOD THEREOF, LAMP AND LIGHT SOURCE USING SAME

(75) Inventors: Kazuhiro Mitani, Ichihara (JP); Takashi Udagawa, Chichibu (JP); Katsuki Kusunoki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 3 days.

(21) Appl. No.: 10/592,510

(22) PCT Filed: Mar. 10, 2005

(86) PCT No.: PCT/JP2005/004713

§ 371 (c)(1),
(2), (4) Date: Jan. 24, 2007

(87) PCT Pub. No.: WO2005/088738

PCT Pub. Date: Sep. 22, 2005

(65) Prior Publication Data

US 2007/0170458 A1    Jul. 26, 2007

Related U.S. Application Data

(60) Provisional application No. 60/553,989, filed on Mar. 18, 2004.

(30) Foreign Application Priority Data

Mar. 12, 2004   (JP)   ............................. 2004-070182

(51) Int. Cl.
*H01L 33/00*   (2006.01)
*H01L 29/221*   (2006.01)
*H01L 29/225*   (2006.01)

(52) U.S. Cl. ................. 257/96; 257/103; 257/E33.025; 257/E33.03; 438/46; 438/47

(58) Field of Classification Search ................... 257/96, 257/103, E33.025, E33.03; 438/46, 47
See application file for complete search history.

(56) References Cited

U.S. PATENT DOCUMENTS 5,798,537 A * 8/1998 Nitta ........................... 257/103
5,900,650 A * 5/1999 Nitta ............................ 257/94

FOREIGN PATENT DOCUMENTS

GB    2 277 405 A    10/1994

(Continued)

OTHER PUBLICATIONS

J.A. Duffy; "General Inorganic Chemistry"; Hirokawa Publishing Co., Ltd.; First Edition Published Apr. 1, 1967; pp. 248-249.

(Continued)

*Primary Examiner*—Ngan Ngo
(74) *Attorney, Agent, or Firm*—Sughrue Mion, PLLC

(57) ABSTRACT

A Group III nitride semiconductor light-emitting device having a stacked structure includes a transparent crystal substrate having a front surface and a back surface, a first Group III nitride semiconductor layer of first conductive type formed on the front surface of the transparent crystal substrate, a second Group III nitride semiconductor layer of second conductive type which is opposite from the first conductive type, a light-emitting layer made of a Group III nitride semiconductor between the first and second Group III nitride semiconductor layers, and a plate body including fluorescent material, attached onto the back surface of the transparent crystal substrate.

18 Claims, 2 Drawing Sheets

FOREIGN PATENT DOCUMENTS

| | | |
|---|---|---|
| JP | 49-19783 | 2/1974 |
| JP | 7-7223 | 1/1995 |
| JP | 8-88407 | 4/1996 |
| JP | 8-88408 | 4/1996 |
| JP | 10-41546 A | 2/1998 |
| JP | 10-209505 A | 8/1998 |
| JP | 2000-261034 A | 9/2000 |
| JP | 2001-210874 A | 8/2001 |
| JP | 2001-244507 A | 9/2001 |
| JP | 2003-165798 A | 6/2003 |
| JP | 2003-243302 | 8/2003 |
| JP | 2003-347588 A | 12/2003 |
| JP | 2004-22785 A | 1/2004 |

OTHER PUBLICATIONS

Isamu Akasaki; "III-V Family Compound Semiconductors—Advanced Electronics Series I-1, Category I: Electronics Materials, Properties and Devices"; Baifukan Publishing Co., Ltd.; pp. 148-149 (May 1994).

Shiro Yoshizawa, et al.; "Inorganic Industrial Chemistry—Basic Lection Series of Industrial Chemistry 5"; Asakura Publishing Co., Ltd.; $6^{th}$ Edition Published Feb. 25, 1973; pp. 168-169, 204-209 and 214-215.

* cited by examiner

GROUP III NITRIDE SEMICONDUCTOR LIGHT-EMITTING DEVICE, FORMING METHOD THEREOF, LAMP AND LIGHT SOURCE USING SAME

CROSS REFERENCE TO RELATED APPLICATIONS

This application is an application filed under 35 U.S.C. § 111(a) claiming the benefit pursuant to 35 U.S.C. § 119(e)(1) of the filing date of Provisional Application No. 60/553,989 filed Mar. 18, 2004 pursuant to 35 U.S.C § 111(b).

TECHNICAL FIELD

The present invention relates to a Group III nitride semiconductor light-emitting device capable of simultaneously emitting light from a light-emitting layer and light having a wavelength different from that of the former light.

BACKGROUND ART

Conventionally, a light-emitting device called a multi-wavelength LED is known as a light-emitting diode (LED) which emits plural kinds of light having different wavelengths (JP-A SHO 49-19783 for example). A multi-wavelength LED which emits short-wavelength visible light beams having different wavelengths includes light-emitting layers emitting light beams having different wavelengths produced from gallium indium nitride ($Ga_YIn_ZN$: $0 \leq Y$, $Z \leq 1$, $Y+Z=1$), wherein ratios of indium composition ratios (=Z) differ (JP-ASHO49-19783). For example, the multi-wavelength LED is formed using $Ga_YIn_ZN$ ($0 \leq Y$, $Z \leq 1$, $Y+Z=1$) light-emitting layer in which indium composition ratios are adjusted so that blue, green and red which are three primary colors of light are emitted (JP-A HEI 08-88407 and JP-A HEI 08-88408, for example).

As another multi-wavelength light-emitting device, there is a known laser diode (LD) in which a Group III nitride semiconductor layer including a plurality of Group V elements, such as nitrogen (N), arsenic (As) and antimony (Sb), is used as a light-emitting layer (JP-A HEI 07-07223 for example). Also in the conventional multi-wavelength LD, the light-emitting layer comprises $AlSb_\alpha As_\beta N_\gamma$ ($0<\alpha$, $\beta$, $\gamma<1$, $\alpha+\beta+\gamma=1$) having different composition ratios so as to emit laser beams of different wavelengths (JP-A HEI 07-07223 for example).

However, in the conventional multi-wavelength light-emitting device, it is necessary to individually form light-emitting layers that emit light corresponding to wavelengths. Thus, in order to emit three primary colors of light, three kinds of $Ga_YIn_ZN$ ($0 \leq Y$, $Z \leq 1$, $Y+Z=1$) light-emitting layers having different indium composition ratios must be formed individually. This makes the procedure of forming the light-emitting layers complicated.

It is also troublesome to electrically isolate light-emitting layers having different composition ratios from each other using etching means or the like. In the conventional multi-wavelength light-emitting device, it is necessary to provide an ohmic electrode on each of the electrically isolated light-emitting layers. Thus, in order to form the conventional multi-wavelength light-emitting device, extremely troublesome procedures, such as crystal growing procedure for a light-emitting layer and device-forming procedure for forming the light-emitting device must be carried out.

The present invention has been accomplished in view of the problems of the conventional techniques, and the invention provides a multi-wavelength light-emitting device which can easily be formed without using the conventional means for individually providing the light-emitting layers for each of multi-wavelengths. That is, the present invention provides a Group III nitride semiconductor light-emitting device which can easily be formed without need of isolating light-emitting layers and which emits light of multi-wavelength.

The present invention has been accomplished as a result of research for providing the semiconductor light-emitting device.

DISCLOSURE OF THE INVENTION

The present invention provides a Group III nitride semiconductor light-emitting device having a stacked structure comprising a transparent crystal substrate having a front surface and a back surface, a first Group III nitride semiconductor layer of first conductive type formed on the front surface of the transparent crystal substrate, a second Group III nitride semiconductor layer of second conductive type which is opposite from the first conductive type, a light-emitting layer made of a Group III nitride semiconductor between the first and second Group III nitride semiconductor layers, and a plate body containing fluorescent material, attached onto the back surface of the transparent crystal substrate.

In the Group III nitride semiconductor light-emitting device, the plate body is made of material having thermal expansion coefficient substantially identical to that of the transparent crystal substrate.

In the first or second mentioned Group III nitride semiconductor light-emitting device, the plate body is made of transparent material through which light from the light-emitting layer can pass.

In any one of the first to third mentioned Group III nitride semiconductor light-emitting devices, the plate body is made of amorphous material.

In any one of the first to fourth mentioned Group III nitride semiconductor light-emitting devices, the plate body is made of glass material.

In any one of the first to fifth mentioned Group III nitride semiconductor light-emitting devices, the plate body is made of material having refractive index smaller than that of the transparent crystal substrate.

The present invention also provides a method of forming a Group III nitride semiconductor light-emitting device, comprising the steps of depositing on a surface of a transparent crystal substrate a first Group III nitride semiconductor layer of first conductive type, a light-emitting layer made of a Group III nitride semiconductor of the first conductive type or second conductive type that is opposite from the first conductive type, and a Group III nitride semiconductor layer of the second conductive type in succession by vapor phase epitaxy means, thereby forming a stacked structure; polishing a back surface of the crystal substrate that is opposite from the surface on which the stacked structure is formed to thin the crystal substrate; and attaching a plate body containing fluorescent material onto the polished back surface of the thinned substrate by anodic oxidation means.

In the method of forming the Group III nitride semiconductor light-emitting device, the plate body is made of material having thermal expansion coefficient substantially identical to that of the transparent crystal substrate.

In the first or second mentioned method of forming the Group III nitride semiconductor light-emitting device, the plate body is made of transparent material through which light from the light-emitting layer can pass.

In anyone of the first to third mentioned methods of forming the Group III nitride semiconductor light-emitting device, the plate body is made of amorphous material.

In any one of the first to fourth mentioned methods of forming the Group III nitride semiconductor light-emitting device, the plate body is made of glass material.

In any one of the first to fifth mentioned methods of forming the Group III nitride semiconductor light-emitting device, the plate body is made of material having refractive index smaller than that of the transparent crystal substrate.

In any one of the first to sixth mentioned methods of forming the Group III nitride semiconductor light-emitting device, the step of polishing the back surface of the crystal substrate comprises rough polished by lapping using grain to thin the crystal substrate and polishing to a mirror surface.

In any one of the first to seventh mentioned methods of forming the Group III nitride semiconductor light-emitting device, the step of polishing the back surface of the crystal substrate comprises etching to a mirror surface.

The present invention also provides a lamp made of any one of the first to fourteenth mentioned Group III nitride semiconductor light-emitting devices, wherein light from the light-emitting layer and light from the plate body optically pumped with the former light are simultaneously emitted.

In the lamp made of the Group III nitride semiconductor light-emitting device, the light from the plate body has colors complementary with respect to the light from the light-emitting layer.

In the first or second mentioned lamp made of the Group III nitride semiconductor light-emitting device, the lamp emits white light by color mixture of the light from the light-emitting layer and the light from the plate body.

The present invention also provides a light source comprising any one of the first to third mentioned lamps.

According to the present invention, a Group III nitride semiconductor light-emitting device is formed as a structure in which a single light-emitting layer is commonly used, and light from the light-emitting layer and fluorescent light from fluorescent material which is optically pumped by the former light can be emitted. Therefore, unlike the conventional technique, it is possible to easily provide a multi-wavelength light-emitting device in which it is unnecessary to individually electrically isolate light-emitting regions in correspondence with light colors and which emits light beams having different wavelengths.

Especially, if a Group III nitride semiconductor LED having attached thereto a plate body containing fluorescent material capable of emitting light of complementary colors with respect to the light from the light-emitting layer is used, an LED lamp having white light can easily be provided.

In the present invention, if a plate body containing fluorescent material is attached onto a back surface of a crystal substrate by means of anodic bonding means, a Group III nitride semiconductor LED capable of emitting light from the light-emitting layer and fluorescence from the fluorescent material can easily be formed.

BEST MODE FOR CARRYING OUT THE INVENTION

Figure 1:
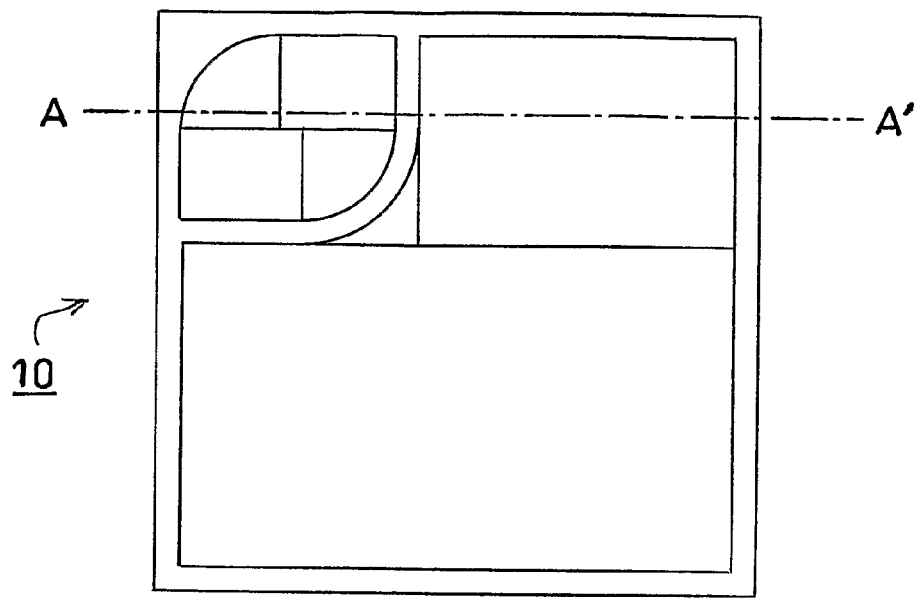
FIG. 1 is a schematic plan view of an LED described in the embodiment.

The Group III nitride semiconductor light-emitting device of the present invention includes a stacked structure having an Group III nitride semiconductor layer formed on one surface of a transparent crystal substrate. Light from the light-emitting layer can optically pass through the transparent crystal. Preferably, the transparent crystal is a transparent monocrystal. Examples thereof are oxide crystals, such as sapphire ($\alpha$-Al$_2$O$_3$ monocrystal), and wide band gap width crystals, such as zinc oxide (ZnO) and silicon carbide (SiC). Some Group III nitride semiconductors require high temperature for growth. Thus, heat resistant monocrystal, such as silicon (Si) monocrystal, can be used as the substrate.

To obtain strong light, it is preferable that the stacked structure is provided with a light-emitting portion of pn double heterojunction (DH) structure. The light-emitting portion is a structure including a DH structure comprising n-type and p-type clad layers and an n-type or p-type light-emitting layer sandwiched between the clad layers. The clad layer is made of aluminum gallium indium nitride (Al$_X$Ga$_Y$In$_Z$N: $0 \leq Y, Z \leq 1, X+Y+Z=1$) for example. The light-emitting layer is made of gallium indium nitride (Ga$_Y$In$_Z$N: $0 \leq Y, Z \leq 1, Y+Z=1$), for example. The clad layer and light-emitting layer may be made of a Group III nitride semiconductor including nitrogen and Group V elements other than nitrogen.

It is preferable that the light-emitting layer is of a quantum well (QW) structure including a single quantum well (SQW) structure or a multi-quantum well (MQW) structure. The quantum well structure is formed while using Ga$_Y$In$_Z$N ($0 \leq Y, Z \leq 1, Y+Z=1$) as a well layer and Al$_X$Ga$_Y$In$_Z$N ($0 \leq X, Y, Z \leq 1, X+Y+Z=1$) as a barrier layer. Further, gallium nitride phosphide (GaN$_{1-a}$P$_a$: $0 \leq a < 1$) is formed as the well layer. The well layer and the barrier layer can be made of an undoped Group III nitride semiconductor layer to which impurities are not intentionally added, or can be made of a Group III nitride semiconductor layer doped with impurities, or can be made of an undoped well layer and a doped barrier layer. The n-type barrier layer doped with a Group IV element, such as silicon (Si) or germanium (Ge), reduces distortion (caused by the piezoelectric effect) affecting the well layer and stabilizes the emission wavelength.

Since the lattice constants are different, it is preferable that a light-emitting portion is formed on one surface of the crystal substrate with inconsistent lattice matching through a buffer layer (low temperature buffer layer) which is allowed to grow at relatively low temperature. When the low temperature buffer layer is made of aluminum nitride (AlN), the layer thickness is in a range of 1 nm to 100 nm, preferably 2 nm to 50 nm, and more preferably 2 nm to 5 nm. If the low temperature buffer layer is interposed, a Group III nitride semiconductor layer having excellent crystallinity can be obtained. Thus, a light-emitting portion having strong light can be obtained from the Group III nitride semiconductor layer allowed to grow through the low temperature buffer layer even when light is taken out from the crystal substrate.

In the present invention, a multi-wavelength light-emitting device is obtained using light which passes through a crystal substrate transparent with respect to light from a light-emitting layer. The strength of light which passes through the crystal substrate is increased as the layer thickness of the crystal substrate is smaller. However, if the thickness of the crystal substrate becomes small, it becomes difficult to handle the crystal substrate in the device-forming procedure. Thus, even when the thickness is made small from the beginning or by polishing or etching, it is preferable that the thickness is 40 μm or more and 200 μm or less, and more preferably 50 μm or more and 150 μm or less. To thin the crystal substrate, lapping means using general grains, such as Carborundum, can be used. Crystal having high hardness, such as sapphire and silicon carbide (SiC), can be lapping-polished or mirror-polished using diamond grains.

A silicon (Si) monocrystal substrate can be thinned by wet etching using a liquid mixture of hydrofluoric acid (HF) and nitric acid ($HNO_3$). A gallium arsenide crystal substrate can be thinned by wet etching using a liquid mixture of ammonium fluoride ($NH_4F$), hydrogen peroxide ($H_2O_2$) and water ($H_2O$). The substrate can be thinned by high frequency plasma etching using halogen gas, such as chlorine gas ($Cl_2$), or chloride gas, such as boron trichloride ($BCl_3$) and silicon tetrachloride ($SiCl_4$). The crystal surface having relatively large roughness subjected to mechanical polishing, such as the lapping, can be formed into a smooth mirror surface using the wet etching or plasma etching.

A plate body containing fluorescent material which absorbs light passing through the crystal substrate and which emits fluorescence is attached onto a back surface of the crystal substrate (the surface of the crystal substrate opposite from the surface on which the stacked structure is provided). Another plate body can also be used if it emits light of another visible region closer to the long wavelength side. For example, a plate body containing yttrium aluminum garnet (YAG) particles to which cerium (Ce) is added is attached. A YAG fluorescent material to which Ce is added absorbs blue light with wavelength of around 460 nm and emits yellow light. Thus, a multi-wavelength LED which emits blue light and yellow light at the same time can be formed from an LED stacked structure having the light-emitting layer which emits blue light and a plate body containing the fluorescent material. That is, according to the invention, the Group III nitride semiconductor LED which emits light of many colors can be formed only by attaching the plate body containing the fluorescent material to the crystal substrate.

In this case, if a portion of the plate body containing fluorescent material is made of transparent material through which blue light from the light-emitting layer can pass, it is possible to provide, for example, a Group III nitride semiconductor LED which emits white light by mixture of blue light and complementary colors with respect to yellow light from the fluorescent material. An LED emitting white light can also be formed by providing a plate body containing fluorescent material emitting fluorescence of red, green and blue. If one plate body containing fluorescent materials which emit three primary colors is used, it becomes unnecessary to isolate the light-emitting regions for each of the primary colors unlike in the conventional technique, and it is possible to provide a Group III nitride semiconductor light-emitting device capable of easily emitting many colors using a single light-emitting layer.

When the multi-wavelength light-emitting device is formed using a single plate body containing a plurality of fluorescent materials emitting fluorescence of different wavelengths, a light-emitting device emitting light of different tones can be obtained by changing the amount of fluorescent materials to be contained in the plate body. It is preferable that the concentration of the fluorescent material to be contained in the plate body is 0.5 weight % or more and 80 weight % or less in accordance with the excitation efficiency of the fluorescent material. More preferably, the concentration is 20 weight % or more and 40 weight % or less. Also in the case of fluorescent materials emitting the same color fluorescence, if fluorescent materials having different excitation efficiencies are contained, the tone of light can be changed. When a Group III nitride semiconductor light-emitting device emitting white light is to be obtained by mixing colors of light from the excited fluorescent material using the same light source, the content of the fluorescent material emitting each color is adjusted while considering the excitation efficiency and visibility of the wavelength of the light source. For example, in the case of fluorescent materials whose excitation efficiencies are reduced in the order of red, green and blue with respect to the same excitation light source, the contents of the fluorescent materials are increased in the opposite order in the case of the excitation efficiencies. That is, in this embodiment, the content of fluorescent material emitting red fluorescence is set greatest, and the content of fluorescent material emitting green is set smallest.

Any known fluorescent materials can be used.

Crystal containing fluorescent material emitting fluorescence may be used as a substrate from the beginning, but in order to obtain strong fluorescence, it is necessary to add fluorescent materials in an amount large enough to cause the substrate to be unsuitable as a monocrystal substrate. A Group III nitride semiconductor layer having excellent crystallinity cannot stably grow on a substrate having inferior crystallinity. To obtain a Group III nitride semiconductor layer emitting strong light and having excellent crystallinity, it is preferable that crystal having excellent crystallinity and having little fluorescent material is used as the substrate. In the present invention, therefore, the stacked structure for the light-emitting device is first formed using as the substrate crystal to which fluorescent material is not intentionally added and the crystal substrate is then thinned. However, the thickness is set to such a value that the crystal substrate can sufficiently support the stacked structure mechanically. Next, the multi-wavelength light-emitting device is obtained by technical means for attaching a plate body including a large amount of fluorescent material to the crystal substrate left standing.

In the present invention, the attachment of the plate body containing the fluorescent material also includes a method for applying a solution containing fluorescent material and solidifying the applied solution. A plate body containing a large amount of fluorescent material can be made of silicon dioxide ($SiO_3$) obtained by applying, to a back surface of a crystal substrate, a solution containing an organic silicon compound admixed with a large amount of fluorescent material and by solidifying the applied solution using sol-gel means. Further, the plate body containing a large amount of fluorescent material can also be formed by solidifying indium-tin compound oxide (ITO) film containing fluorescent material formed using sol-gel means. Such amorphous material does not have strong connection between the constituent materials and thus, lattice mismatch with respect to the crystal substrate can be moderated, and a plate body without crack caused by lattice mismatch can be obtained.

The plate body can be melted at relatively low temperature and can be made of amorphous glass material admixed with a large amount of fluorescent material. Examples of the amorphous glass are silica glass (Kogyo Kagaku Kiso Koza 5 "Muki Kogyo Kagaku," written by Shiro YOSHIZAWA, published by Asakura Shoten Co., Ltd. on Feb. 25, 1973, sixth edition, p. 169), silicate glass, such as soda-lime glass ("Muki Kogyo Kagaku" mentioned above, pp. 205 to 206), and boric acid glass having a portion of silica substituted with boron oxide ("Muki Kougyou Kagaku" mentioned above, p. 207). Concretely, the amorphous glass is 96% silica glass. Especially, low expansion glass material, such as low expansion boric acid glass ("Muki Kougyou Kagaku" mentioned above, p. 208) and glass ceramic, can reduce thermal stress applied to the crystal substrate to which the material is attached and does not generate cracks, and therefore a Group III nitride semiconductor light-emitting device can effectively be formed. Recently, a technique for preparing ultra-fine particles having a diameter of 5 nm or less using the sol-gel method and holding the same in glass has been established, and it is possible to use material having better light-emitting efficiency as fluorescent material, and it is preferable that a plate body made of this material is used.

A plate body containing fluorescent material is preferably made of material having substantially the same coefficient of linear expansion as the crystal substrate. For example, amorphous glass having linear expansivity of $3 \times 10^{-6}$/K or more and $8 \times 10^{-6}$/K or less is attached onto a back surface of a substrate made of silicon carbide (SiC) crystal having coefficient of linear expansion of about $5 \times 10^{-6}$/K ("Group III-V compound semiconductor," BAIFUKAN CO., LTD., published on May 20, 1994, first edition, p. 148). The thickness of the amorphous glass to be attached is preferably 100 μm or more and 300 μm or less.

A plate body containing fluorescent material is preferably made of material having smaller refractive index than the crystal substrate. For example, a plate body to be attached onto a sapphire substrate having refractive index of about 2.0 can be made of glass having refractive index of 1.3 or more and less than 2.0. The plate body can preferably be made of glass having refractive index of between refractive index of crystal forming the substrate and refractive index of epoxy resin generally used for sealing the light-emitting device. The plate body can preferably be made of glass having refractive index of 1.5 or more and 1.8 or less.

Examples of glass having refractive index of 1.5 to 1.8 with respect to the d-line of sodium (Na) having wavelength of 587 nm are optical glasses, such as crown (K), borosilicate crown (BK), barium crown (BaK), flint (F), barium flint (BaF), lanthanum crown (LaK), lanthanum flint (LaF) based glass ("Muki Kougyou Kagaku" mentioned above, p. 214).

To attach a plate body, such as glass, onto a crystal substrate, anode bonding means can be used. In this means, negative (−) voltage to be applied to the glass plate body is preferably 100 V or more and 1200 V or less. If the applied voltage is higher, the attaching operation is facilitated, but yields are deteriorated. Thus, preferable applied voltage is in a range of 200 V to 700 V, and more preferably 300 V or more and 500 V or less. If the crystal substrate or plate body is heated, the attaching operation is further facilitated. The heating temperature is preferably 200° C. or more and 700° C. or less. As the attaching temperature is set higher, voltage to be applied to the crystal substrate and plate body can be set lower. If the attaching temperature is set lower, it is necessary to set the applied voltage higher. Glass suitable to be attached using anodic bonding means is glass containing alkali. Silicate glass, such as soda-lime glass, is suitable.

The stacked structure provided on the surface of the crystal substrate is processed after attachment of the plate body containing the fluorescent material, and n-type and p-type ohmic electrodes are formed to form a light-emitting device. For example, an ohmic electrode having any pole is not provided on the crystal substrate, but electrodes having both poles are disposed on the surface of the stacked structure to form the light-emitting device. For example, a p-type ohmic electrode is provided on a p-type contact layer made of a Group III nitride semiconductor of a first conductive type (e.g., p-type layer) forming the uppermost layer of the stacked structure. In the case of the Group III nitride semiconductor light-emitting device of this invention, light from the light-emitting layer is not taken outside from the contact layer of the stacked structure, but the light is emitted in a direction where the plate body is attached. Therefore, the p-type ohmic electrode disposed on the p-type contact layer existing on the opposite side from the direction where the light is taken out need not have a translucent or transparent function, and a so-called mat-type electrode in which thick metal film is disposed on substantially the entire surface of the contact layer may be used.

On the other hand, the n-type ohmic electrode is formed after p-type contact layer or light-emitting layer is removed in a region of a portion of the p-type contact layer and a surface of n-type Group III nitride semiconductor layer of second conductive type (since the first conductive type is temporarily be set to a p-type, the second conductive type is an n-type) is exposed. Then-type ohmic electrode may be made of transition metal, such as aluminum (Al), titanium (Ti) and chromium (Cr), and alloy thereof.

If the upper most surface layer of the light-emitting layer, i.e., the mat-type electrode provided on the contact layer in a direction opposite from the direction where light is taken outside is made of metal which can reflect light and which forms ohmic contact, the electrode enables current to smoothly flow to the light-emitting layer and light to be reflected toward the plate body containing the fluorescent material. Thus, it is convenient to excite the fluorescent material, and strong fluorescence can be obtained. A metal reflection film suitable for reflecting light of relatively short wavelength emitted from the Group III nitride semiconductor light-emitting layer is preferably of two layer structure including a thin metal layer which can form a semiconductor layer and ohmic contact and through which light can pass, and a metal layer capable of reflecting the passing light. Examples of ohmic bonding metal are six elements in the platinum group ("Duffy Mukikagaku," published by Hirokawa Shoten Co., Ltd. on Apr. 15, 1971, fifth edition, p. 249), such as rhodium (Rh), palladium (Pd) and platinum (Pt), and metals, such as Ni, Au, Co, Ti, Cr, W and Ta, and alloy thereof. Examples of the reflection film are six elements in the platinum group ("Duffy Mukikagaku," as mentioned above, p. 249), such as rhodium (Rh), palladium (Pd) and platinum (Pt), and metals, such as Ag and Au, and alloy thereof.

The light-emitting device of the invention can simultaneously emit light from the light-emitting layer comprising the Group III nitride semiconductor and light from the plate body containing fluorescent material. Thus, from the Group III nitride semiconductor light-emitting device of the present invention, a lamp capable of emitting multi-wavelength light, in spite of being a single device, can be formed. Especially from the Group III nitride semiconductor light-emitting device of the invention having the plate body capable of emitting fluorescence having complementary colors with respect to the color of light from the Group III nitride semiconductor light-emitting layer, a lamp emitting white light can be formed. If a Group III nitride semiconductor light-emitting device comprising a Group III nitride semiconductor light-emitting layer and a plate body and emitting light corresponding to three primary colors is used, a lamp emitting white color can be provided. If the content of fluorescent material in the plate body emitting fluorescence is changed, a lamp emitting white light having different tones can be provided.

If the Group III nitride semiconductor light-emitting device (chip) of the invention in which both n-type and p-type ohmic electrodes are provided on one surface of the stacked structure is used, a lamp having the chip mounted in the flip type manner can be formed. If material emitting fluorescence is mounted on the Group III nitride semiconductor light-emitting device of the invention in which the plate body attached onto the back surface of the crystal substrate is mounted on the upper surface in the flip type manner flatly, it is possible to form a lamp which simultaneously emits light from the light-emitting layer and fluorescence from the attached plate body and fluorescence from the mounted fluorescent material. Even if the fluorescence material is not mounted on the attached plate body, if it is sealed with resin containing the fluorescent material emitting fluorescence, it is possible to form a lamp which simultaneously emits fluorescence from the plate body attached onto the light-emitting layer and fluorescence from the fluorescent material contained in the sealing resin.

If lamps which emit visually white color by color mixture of the light from the light-emitting layer and fluorescence from the attached plate body are combined, a white light source can be formed. According to the present invention, it is possible to form a lamp emitting white light using a single light-emitting layer. That is, unlike in the conventional technique, it is unnecessary to combine three light-emitting devices emitting three primary colors of light, or to prepare a large chip for emitting the three primary colors from one chip. Thus, since a plenty of lamps can be mounted on a limited flat region, it is possible to form a light source emitting strong white light. If not a a lamp emitting white light, but a lamp having the Group III nitride semiconductor multi-color light-emitting device of the invention is used, a plenty of lamps can be mounted on the limited flat area and thus, it is possible to provide a color light source having the great number of pixels.

A plate body attached onto a back surface of a thinned crystal substrate by the anodic bonding means functions as an illuminator which receives light from the light-emitting layer comprising a Group III nitride semiconductor and which emits light.

EXAMPLE

The present invention will be explained concretely based on a case in which a lamp for emitting light from an LED formed on a sapphire substrate and light from a plate body containing fluorescent material attached onto the sapphire substrate is formed.

Figure 2:
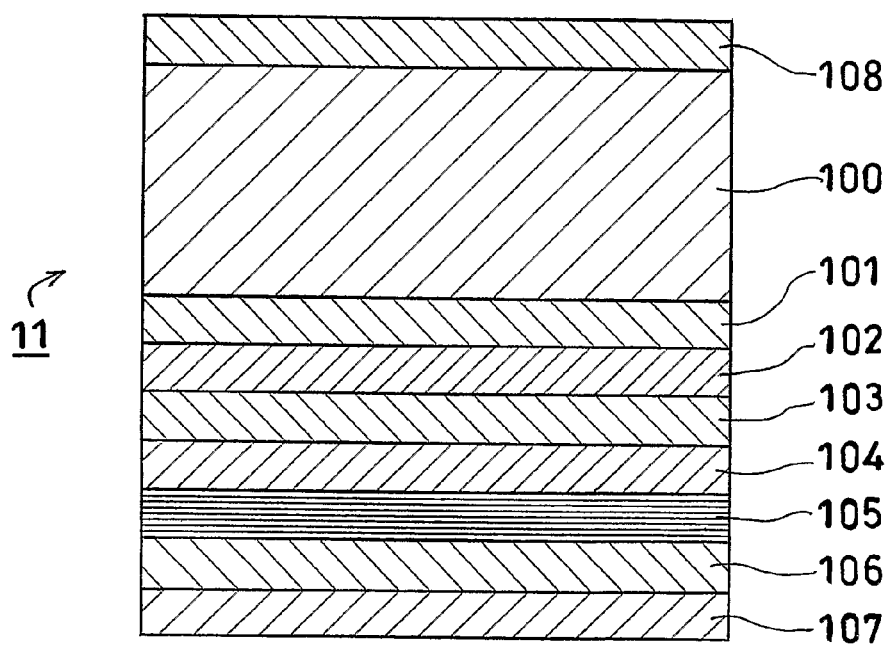
FIG. 2 is a schematic sectional view of a stacked structure used in the LED shown in FIG. 1.
Figure 3:
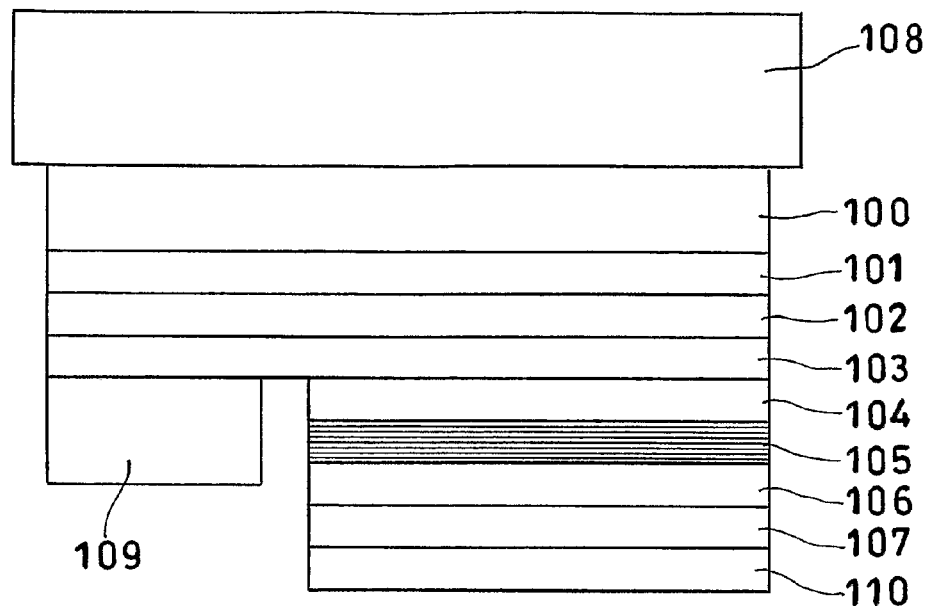
FIG. 3 is a sectional view taken along broken line III-III in FIG. 1.
Figure 4:
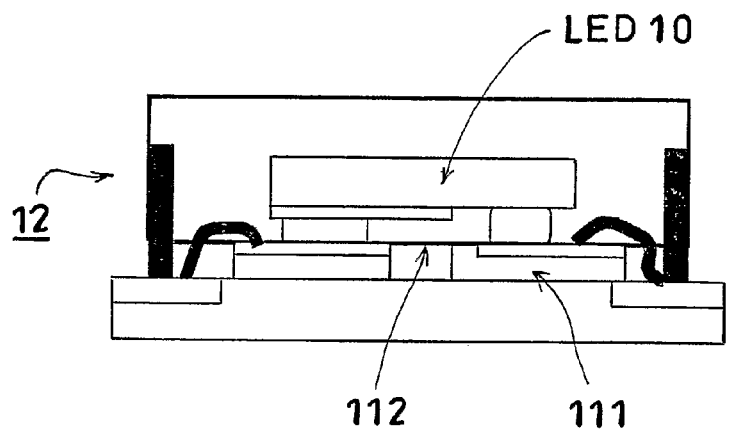
FIG. 4 is a schematic sectional view of a lamp.

FIG. 1 is a schematic plan view of an LED 10 described in this Example. FIG. 1 shows the plan view as viewed from a surface of a stacked structure 11 shown in FIG. 2 used for forming the LED 10. FIG. 3 is a schematic sectional view taken along broken line III-III of the LED 10 shown in FIG. 1. FIG. 4 is a schematic sectional view of a lamp using the semiconductor light-emitting device of the present invention.

A stacked structure 11 for forming the LED 10 was formed in such a manner that the following layers 101 to 110 were deposited in succession on a (0001) sapphire substrate 100. The layers of the following paragraphs (1) to (7) were allowed to grow by metal-organic chemical vapor deposition (MOCVD). Especially GaN buffer layer 101 was allowed to grow by seeding process (SP) means (JP-A 2003-243302).

(1) undoped GaN buffer layer 101 (thickness=5 nm)

(2) undoped AlN buffer layer 102 (thickness=15 nm)

(3) silicon (Si)-doped n-type $Ga_{X1}In_{1-X1}N$ ($0 \leq X_1 \leq 1$) contact layer 103 (thickness=2.5 μm, n=8×10$^{18}$/cm$^3$)

(4) Si-doped n-type $Ga_{X2}In_{1-X2}N$ ($X_1 \leq X_2 \leq 1$) clad layer 104 (thickness=0.5 μm, n=4×10$^{18}$/cm$^3$)

(5) light-emitting layer 105 (stacking frequency=5) of multiple quantum well structure of Si delta doping GaN barrier layer and $Ga_{0.8}In_{0.2}N$ well layer (6) Mg-doped p-type AlGaN clad layer 106 (thickness=2.5 nm, p=8×10$^{17}$/cm$^3$)6

(7) Mg-doped p-type GaN contact layer 107 (thickness=0.2 μm, p=2×10$^{18}$/cm$^3$)

After the stacked structure 11 for the LED 10 was formed, a back surface (surface opposite from one on which the stacked structure 11 was formed) of the sapphire substrate 100 was lapping-polished. Then, the resultant surface was finely polished using diamond fine particles having smaller particle diameter and is finished to a mirror-smooth state.

With this, the thickness of the sapphire substrate 100 was reduced from the initial 350 μm to 90 μm.

A soda-lime glass plate 108 about 350 μm in thickness containing YAG fluorescent material to which cerium (Ce) is added was attached onto the back surface of the mirror-finished surface of the sapphire substrate 100. The transparent glass plate containing fluorescent material was prepared through melting the soda-lime glass during which Ce-YAG fine particles were added and dispersed. The Ce-YAG fine particles were added such that the content thereof in the glass plate 108 became 10 weight %. The sapphire substrate 100 and the amorphous glass substrate 108 were attached onto each other by the anodic bonding means. The attaching operation was carried out at the room temperature, and the voltage applied between the sapphire substrate 100 and the amorphous glass substrate 108 was 220 V.

Then, the surface of the stacked structure 11 is worked using the known photolithography and selective etching to expose the surface of an n-type contact layer 103. On the surface of the exposed n-type contact layer 103 was formed an n-type ohmic electrode 109 of three layer structure of chromium (Cr)-titanium (Ti)-gold (Au). The metal layers forming the n-type ohmic electrode 109 were formed using general vacuum deposition means or electron beam deposition means. The uppermost layer of the electrode 109 was formed as gold (Au) film to facilitate the wire bonding operation.

On substantially the entire front surface of the p-type GaN contact layer 107 is formed a p-type ohmic electrode 110 of stacked structure of Pt and Au. After these metal films were deposited, these metal films were heated to about softening temperature which is lower than the softening temperature of the glass plate 108, thereby enhancing adhesion to the p-type GaN contact layer 107. At the time of cooling operation after the heating operation, it was cooled slowly over a long period of time so that the glass plate 108 containing fluorescent material was not peeled off and that no crack was generated in the stacked structure 11.

Thereafter, division grooves for dividing the device were formed on the side of the surface of the stacked structure 11 by the laser scribing method. Then, mechanical pressure was applied to the division groove using a general breaker to divide the device into individual devices (chips), thereby forming the Group III nitride semiconductor light-emitting devices (chips) 10.

The Group III nitride semiconductor light-emitting device chip 10 obtained through the above procedure was mounted on a conductive, low-resistant Si monocrystal plate 111. The chip 10 was mounted using a general flip chip (FC) bonder after a gold (Au) bump was formed at a mount position. An aluminum (Al) reflection film 112 was formed on the entire surface of the Si monocrystal plate 111 so that blue light having wavelength of about 460 nm from the light-emitting layer 105 could easily be reflected. The LED 10 was provided at its one surface with the Si monocrystal plate 111 and at its other surface with the glass plate 108 containing fluorescent material was sealed with normal epoxy resin, and the light-emitting diode lamp 12 having a cross-sectional structure shown in FIG. 4 was completed.

The forward current of 20 mA was allowed to flow between the n-type and p-type ohmic electrodes 109 and 110 of the LED 10 to allow the lamp 12 to emit light. Upon the flow of current, blue light from the light-emitting layer 105 and yellow fluorescence from the glass plate 108 containing Ce-YAG fluorescent material were simultaneously emitted, the LED lamp 12 emitting visually observable white light by the color mixture could be provided. An LED lamp emitting white light and having strong brightness could be provided. According to the lamp, the brightness of the white light measured using a general integrating sphere was 20 lumen (lm)/watt (W).

INDUSTRIAL APPLICABILITY

The Group III nitride semiconductor light-emitting device of the present invention can be used as a multi-wavelength light-emitting device. For example, red, green and blue light can simultaneously emitted to obtain white light.

The invention claimed is:

1. A Group III nitride semiconductor light-emitting device having a stacked structure comprising:
    a transparent crystal substrate having a front surface and a back surface;
    a first Group III nitride semiconductor layer of a first conductive type formed on the front surface of the transparent crystal substrate;
    a second Group III nitride semiconductor layer of a second conductive type which is opposite from the first conductive type;
    a light-emitting layer made of a Group III nitride semiconductor between the first and second Group III nitride semiconductor layers; and
    a plate body including fluorescent material, attached onto the back surface of the transparent crystal substrate,
    wherein the plate body is thicker than the transparent crystal substrate.

2. The Group III nitride semiconductor light-emitting device according to claim 1, wherein the plate body is made of material having thermal expansion coefficient substantially identical to that of the transparent crystal substrate.

3. The Group III nitride semiconductor light-emitting device according to claim 1, wherein the plate body is made of transparent material through which light from the light-emitting layer can pass.

4. The Group III nitride semiconductor light-emitting device according to claim 1, wherein the plate body is made of amorphous material.

5. The Group III nitride semiconductor light-emitting device according to claim 1, wherein the plate body is made of glass material.

6. The Group III nitride semiconductor light-emitting device according to claim 1, wherein the plate body is made of material having refractive index smaller than that of the transparent crystal substrate.

7. A method of forming a Group III nitride semiconductor light-emitting device having a stacked structure comprising:
    a transparent crystal substrate having a front surface and a back surface:
    a first Group III nitride semiconductor layer of a first conductive type formed on the front surface of the transparent crystal substrate;
    a second Group III nitride semiconductor layer of a second conductive type which is opposite from the first conductive type;
    a light-emitting layer made of a Group III nitride semiconductor between the first and second Group III nitride semiconductor layers; and
    a plate body including fluorescent material, attached onto the back surface of the transparent crystal substrate,
    wherein the plate body is thicker than the transparent crystal substrate, the method comprising:
    depositing on the front surface of the transparent crystal substrate the first Group III nitride semiconductor layer of the first conductive type, the light-emitting layer made of the Group III nitride semiconductor of the first conductive type or a second conductive type that is opposite from the first conductive type, and the Group III nitride semiconductor layer of the second conductive type in succession by vapor phase epitaxy means, thereby forming a stacked structure;
    polishing the back surface of the crystal substrate that is opposite from the front surface on which the stacked structure is formed to thin the crystal substrate; and
    attaching the plate body including fluorescent material onto the polished back surface of the thinned substrate by anodic oxidation means.

8. The method of forming the Group III nitride semiconductor light-emitting device according to claim 7, wherein the plate body is made of material having thermal expansion coefficient substantially identical to that of the transparent crystal substrate.

9. The method of forming the Group III nitride semiconductor light-emitting device according to claim 7, wherein the plate body is made of transparent material through which light from the light-emitting layer can pass.

10. The method of forming the Group III nitride semiconductor light-emitting device according to claim 7, wherein the plate body is made of amorphous material.

11. The method of forming the Group III nitride semiconductor light-emitting device according to claim 7, wherein the plate body is made of glass material.

12. The method of forming the Group III nitride semiconductor light-emitting device according to claim 7, wherein the plate body is made of material having refractive index smaller than that of the transparent crystal substrate.

13. The method of forming the Group III nitride semiconductor light-emitting device according to claim 7, wherein the step of polishing the back surface of the crystal substrate comprises rough polishing by lapping using grain to thin the crystal substrate and polishing to a mirror surface.

14. The method of forming the Group III nitride semiconductor light-emitting device according to claim 7, wherein the step of polishing the back surface of the crystal substrate comprises etching to a mirror surface.

15. A lamp made of the Group III nitride semiconductor light-emitting device according to claim 1, wherein light from the light-emitting layer and light from the plate body optically pumped with the light from the light-emitting layer are simultaneously emitted.

16. The lamp made of the Group III nitride semiconductor light-emitting device according to claim 15, wherein the light from the plate body has complementary colors with respect to the light from the light-emitting layer.

17. The lamp made of the Group III nitride semiconductor light-emitting device according to claim 15, wherein the lamp emits white light by color mixture of the light from the light-emitting layer and the light from the plate body.

18. A light source comprising the lamp according to claim 15.

* * * * *